United States Patent [19]
Joshi

[11] 3,836,993
[45] Sept. 17, 1974

[54] MAGNETIC FIELD DEPENDENT FIELD EFFECT TRANSISTOR

[75] Inventor: Vishnuprakash Joshi, Bangalore, India

[73] Assignee: Licentia Patent-Verwaltungs-G.m.b.H., Frankfurt am Main, Germany

[22] Filed: Oct. 18, 1973

[21] Appl. No.: 407,669

Related U.S. Application Data

[63] Continuation of Ser. No. 212,510, Dec. 27, 1971, abandoned.

[52] U.S. Cl. .................. 357/27, 357/22, 357/55, 357/58
[51] Int. Cl. .................. H01l 11/14
[58] Field of Search .................. 317/235 A, 235 H

[56] References Cited

UNITED STATES PATENTS

| | | | |
|---|---|---|---|
| 3,448,353 | 6/1969 | Gallagher et al. | 317/235 H |
| 3,585,462 | 6/1971 | Lehovic | 317/235 H |
| 3,668,439 | 6/1972 | Fujikawa et al. | 317/235 H |
| 3,714,523 | 1/1973 | Bate | 317/235 H |

OTHER PUBLICATIONS

Wallmark et al., Field Effect Transistors (Prentice-Hall, Englewood Cliffs, N.J.) 1966, page XXII.

*Primary Examiner*—Rudolph V. Rolinec
*Assistant Examiner*—William D. Larkins
*Attorney, Agent, or Firm*—Spencer & Kaye

[57] ABSTRACT

A magnetic field effect transistor comprises a semiconductor body with a region of a specific type of conductivity, a source and a drain electrode between which is provided a channel region formed by a narrowed part of the region of the specific type of conductivity at least one barrier layer defining the channel region and controlling the channel region through the space charge region issuing from the barrier layer, and at least one additional electrode positioned laterally of the direct charge carrier path between the source and drain electrodes and to which at least part of the charge carrier can be deflected in the presence of a suitable magnetic field.

15 Claims, 2 Drawing Figures

A-A'

MAGNETIC FIELD DEPENDENT FIELD EFFECT TRANSISTOR

This application is a continuation of aplication Ser. No. 212,510, filed Dec. 27, 1971, now abandoned.

BACKGROUND OF THE INVENTION

The invention relates to a magnetic field dependent field effect transistor, the controllable current of which may be deflected, by the action of a magnetic field, to at least one additional electrode.

Magnetic field dependent transistors are already known. A known bipolar transistor has two collector regions arranged symmetrically relative to the center of the emitter region. According to the polarity of the magnetic field acting on the transistor, the current injected by the emitter is deflected to a greater or lesser extent to one or the other collector electrode.

SUMMARY OF THE INVENTION

The present invention has the object of providing a particularly sensitive magnetic field dependent transistor which can be controlled with very small magnetic fields. According to the invention, there is provided a magnetic field dependent field effect transistor comprising a semiconductor body, a region of a specific type of conductivity in said semiconductor body, two main ohmic electrodes forming source and drain electrodes, a narrowed portion of said region of said specific type of conductivity positioned between said two main electrodes to form a channel region containing a direct path for charge carries between said two main electrodes, at least one barrier layer defining said channel region and controlling said channel region by means of a space charge region issuing from said barrier layer and at least one additional electrode positioned laterally of said direct path for said charge carriers between said two main electrodes and to which at least a part of said charge carriers are deflected in the presence of a magnetic field of suitable direction and polarity

BRIEF DESCRIPTION OF THE DRAWINGS

The invention will now be described in greater detail, by way of example, with reference to the accompanying drawings, in which.

DESCRIPTION OF THE PREFERRED EMBODIMENT

Figure 1:
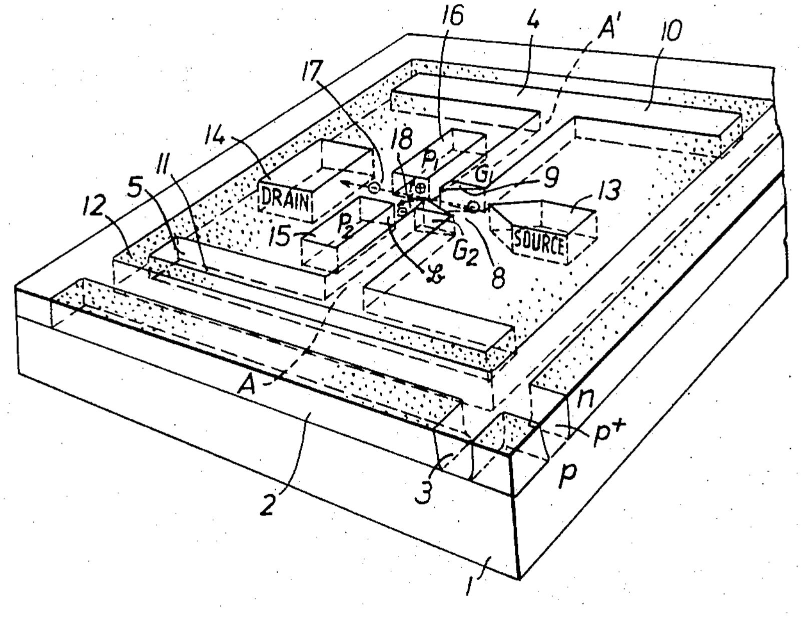
FIG. 1 is a perspective phantom view of one form of transistor according to the invention.

The invention proposes to provide a magnetic field dependent transistor by mounting, on a semiconductor region of the first type of conductivity, two ohmic main electrodes as source and drain electrodes, by narrowing this region in a part between the two main electrodes to form a channel region which is defined by at least one barrier layer and can be controlled by the space-charge region issuing from this barrier layer, wherein at least one additional electrode is arranged between the narrower part and the drain electrode laterally of the direct charge carrier path between the two main electrodes, to which additional electrode at least a part of the charge carriers is deflected in the presence of a magnetic field of suitable direction and polarity.

In the semiconductor arrangement according to the invention it is therefore possible to control the current flowing between the two main electrodes both by means of an electric field and by means of a magnetic field. The transistor according to the invention is particularly sensitive if the electric field is so chosen that the space-charge region issuing from the barrier layer just cuts off the channel region if no magnetic field acts on the transistor. Under the action of a magnetic field, the space-charge region is pushed back so far that a current, corresponding to the magnetic field, flows through the channel region. Owing to this arrangement, small magnetic fields are sufficient for controlling the transistor.

Preferably, the magnetic control field extends perpendicularly to the direction of movement of the charge carriers between the two main electrodes, or between the source electrode and one of the additional electrodes. Under the assumption that all contacts are arranged on the field effect transistor according to the invention on one surface of a disc-shaped semiconductor, the magnetic field extends preferably perpendicularly to this surface of the semiconductor body. However, a magnetic field will affect the flow of current through the transistor even in the case where the direction of the magnetic field forms an angle with the said surface of the semiconductor.

In a preferred embodiment of the field effect transistor according to the invention, a high-ohmic semiconductor base is used which either acts as insulator or has a certain type of conductivity. A semiconductor layer having the first type of conductivity, and made preferably epitaxially, is mounted on this base. Preferably, all contacts on this semiconductor region are made by providing recesses in the semiconductor region with the first type of conductivity at the points where the contacts are to be made. If the base is an insulator, the recesses may extend to the semiconductor base; if the semiconductor base has the conductivity opposite to that of the semiconductor region, the recesses will terminate just above the surface of the semiconductor base. These recesses are filled partially or entirely with metal. Preferably, for the main and additional deflecting electrodes a metal will be chosen which forms ohmic contacts with the region having the first type of conductivity. For the control electrodes, a metal will be preferably selected which forms a rectifying Schottky contact with the semiconductor region with the first type of conductivity. Thus, a barrier layer is formed between the control electrode or electrodes and the semiconductor region with the first conductivity, which generates, when the barrier layer is stressed in the blocking direction, a space-charge region, which is used for restricting the channel region. The extent of this space-charge region may be also affected by the magnetic field, because the charge carrier paths are modified by the Lorentz force caused by the magnetic field. Simultaneously, the charge carriers forming the current between the two main electrodes are displaced in a direction as a function of the direction of the field, and are collected by one of the additional electrodes. The deflecting current is indicative of the magnitude of the field. In addition, a multitude of control processes may be carried out by using the variable currents.

The Schottky contacts for the control electrodes may also be replaced by ohmic contacts, if these contacts are arranged in a region having the second type of conductivity. In this manner, the barrier layer formed by the Schottky contacts is replaced by one or more *p-n* junctions, the space-charge region of which is also adapted to be controlled.

Figure 2:
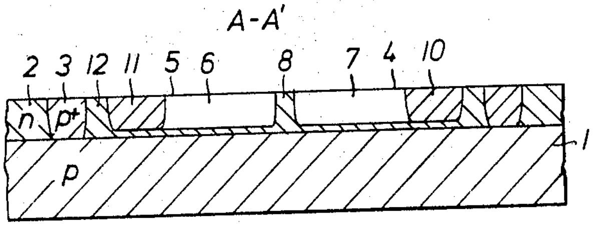
FIG. 2 is a sectional view taken along the line A—A' of FIG. 1.

Referring now to the drawings the semiconductor arrangement of FIGS. 1 and 2 consists of a preferably high-ohmic, or high resistivity, semiconductor base 1, for example of *p*-type conductivity. A preferably epitaxially produced semiconductor layer is formed on this base, having an *n*-type conductivity with a *p*-type conductivity base, and a thickness of, e.g., about 10$\mu$m.

For limiting and isolating the transistor region, a part of the semiconductor layer 2 with the first conductivity is surrounded by a separating semiconductor region 3 which is preferably low-ohmic. This region which extends to the semiconductor base, is, for example, of *p* + type conductivity and has a rectangular configuration.

Two recesses are made in the semiconductor layer 2 extending to or almost to the semiconductor base and arranged in such a way that a narrow semiconductor web remains between them, forming the channel region 8. These recesses are filled with metal which forms with the semiconductor layer 2 rectifying Schottky contacts 4 and 5. When the Schottky contact junctions are stressed in the blocking direction, they generate a space-charge region which can be controlled by the voltage applied to the control electrodes.

The Schottky contacts 4 and 5 have, for example, the shape of a T, as shown in FIG. 1. Preferably, they are arranged symmetrically relative to the direct path 17 of the charge carriers between the two main electrodes. The ends of the bases 6 and 7 of the T are separated by the narrow semiconductor web 8, forming the restricted channel region. The cross bars 10 and 11 of the T-shaped Schottky contacts abut on the separating region 3 in such a way that a current flow between the two main electrodes 13 and 14 through a semiconductor region between the separating region 3 and the Schottky contacts 4 and 5 is impossible. As shown in FIG. 1, the edges of the cross bars of the T-shaped Schottky contacts extend in a preferred embodiment parallel to the inner edge of the separating zone 3. Between the zone 3 and the Schottky contact 4 or 5 there remains a small semiconductor region 12, having the conductivity of the semiconductor layer 2. During the operation of the field effect transistor, however, a blocking voltage is applied to the Schottky contacts and gives rise to a space-charge region issuing from all edge surfaces of the Schottky contacts. This space-charge region restricts the semiconductor region 12 along a large edge, so that this path can carry no undesirable leakage current from the source electrode to the drain electrode. The same applies also for the thin semiconductor region with *n*-type conductivity remaining between the semiconductor base and the Schottky contacts. The space-charge region extends from the Schottky contacts also towards the bottom and prevents here an undesirable current flow. At the same time, the space-charge region also extends into the channel 8. Owing to the voltage drop along the channel, the space-charge region 9 has at this point the shape of a wedge, wherein the two wedge points, starting from the contacts 4 and 5 make contact at a certain voltage applied to the control electrodes 4 and 5, thereby preventing the flow of current, except for the cut-off, or saturation, current, between the source 13 and the drain 14. This is under the assumption that a working voltage is applied between the source and the drain which gives rise to the current flow through the channel and to the wedge-shaped configuration of the space-charge region 9.

The main electrodes 13 and 14, also called the source and the drain, are preferably also located in recesses which extend to or almost to the semiconductor base 1. For forming the main electrode, these recesses are filled with a metal which forms ohmic contacts with the semiconductor layer 2.

To the left and right of the direct charge carrier path 17 between the two main electrodes there are additional collector electrodes 15 and 16 (P1 and P2). These collector electrodes collect the charge carriers deflected from the direct charge carrier path by a magnetic field acting thereon.

If a magnetic field 18 acts on the semiconductor arrangement of FIGS. 1 and 2 with a direction perpendicular to the semiconductor surface and out of the plane of the drawing, the electron charge carriers are deflected to the collector electrode 15. If the magnetic field has the opposite polarity, the electrons are deflected to the collector electrode 16.

The additional collector electrodes 15 and 16 may be applied to the semiconductor layer by evaporation. In order to prevent recombinations on the way to the semiconductor surface, it is recommended to provide recesses at the points provided for the collector electrodes, extending to or almost to the semiconductor base. These recesses are then filled entirely or partially with a metal, forming ohmic contacts with the semiconductor region 2, for forming the collector electrodes.

As already mentioned, during the operation a blocking voltage is applied to the Schottky contacts 4 and 5 against the semiconductor layer 2, whereby the channel region is just blocked. Under the action of a magnetic field, the space-charge region is pushed back to an extent dependent on the strength of the magnetic field, and the flow of current becomes again possible between the source and the drain electrodes. At the same time, the current is deflected to one of the two collector electrodes to an extent depending on the magnetic field strength.

It may easily be seen that the current flow through the semiconductor arrangement according to the invention can be controlled by the blocking voltage on the Schottky contacts 4 and 5, and by an external magnetic field. By means of the currents collected by the collector electrodes and the drain with different strengths and polarities of the magnetic field, widely varying control and regulating processes may be initiated as a function of the magnetic field.

The field effect transistor according to the invention is also suitable for use as a magnetic field dependent switch or for measuring magnetic fields. A calibrating curve may be plotted for the transistor in which certain current values measured at the control electrodes, or at the drain, at a certain source gate voltage and a certain control voltage, correspond directly to a certain field strength of an external magnetic field.

The semiconductor material for the transistor arrangement just described may be, for example, silicon or gallium arsenide. With the use of silicon and an *n*-type conductivity surface layer 2, a suitable material for the Schottky contacts is gold, aluminum, molybdenum of palladium. The conductivity of the semiconductor regions and layers may be opposite to the conductivity types mentioned in the embodiment.

It will be understood that the above description of the present invention is susceptible to various modifications changes and adaptations.

What is claimed is:

1. A magnetic field dependent field effect transistor comprising a semiconductor body, a region of a specific type of conductivity in said semiconductor body, two main ohmic electrodes forming source and drain electrodes, a narrowed portion of said region of said specific type of conductivity positioned between said two main electrodes to form a channel region containing a direct path for charge carriers between said two main electrodes, at least one barrier layer defining said channel region and controlling said channel region by means of a space charge region issuing from said barrier layer and at least one additional electrode positioned laterally of said direct path for said charge carriers and located between said drain electrode and said channel region, said space charge region extending into said channel region in a direction which lies in the plane defined by said source and drain electrodes and said additional electrode, said transistor being arranged to permit a magnetic field component perpendicular to said plane to push back said space charge region, so as to vary the width of said channel region, to an extent dependent on the strength of such magnetic field component, and to deflect such charge carriers in a direction normal to, and to an extent dependent on the strength of, such magnetic field component, and said additional electrode being positioned to receive at least part of the charge carriers which have been thus deflected.

2. A field effect transistor as defined in claim 1, further comprising at least one control electrode defining said barrier layer for controlling said space-charge region and means for supplying to said control electrode a voltage for causing said channel region to be just blocked by said space-charge region or regions issuing from said barrier layer or layers in the absence of said magnetic field.

3. A field effect transistor as defined in claim 1, further comprising means for providing a magnetic control field extending perpendicularly to the direction of movement of said charge carriers between said source electrode and said drain or said additional electrode.

4. A field effect transistor as defined in claim 1, wherein said semiconductor body comprises a high resistivity base and said region of said specific type of conductivity comprises a semiconductor layer arranged on said high resistivity base.

5. A magnetic field dependent field effect transistor comprising a semiconductor body composed of a high resistivity base, a region of a specific type of conductivity in said semiconductor body, said region including a semiconductor layer arranged on said high resistivity base, two main ohmic electrodes forming source and drain electrodes, a narrowed portion of said region of said specific type of conductivity positioned between said two main electrodes to form a channel region containing a direct path for charge-carriers between said two main electrodes, at least one barrier layer defining said channel region and controlling said channel region by means of a space charge region issuing from said barrier layer and at least one additional electrode positioned laterally of said direct path for said charge-carriers and located between said drain electrode and said channel region, at least a part of said charge-carriers being deflected to said additional electrode in the presence of a magnetic field of suitable direction and polarity, wherein said semiconductor layer of said specific type of conductivity defines two recesses extending to or near said semiconductor base leaving between them a narrow web forming said channel region.

6. A field effect transistor as defined in claim 5, further comprising rectifying Schottky contacts contacting said semiconductor layer of said specific type of conductivity and formed by filling said recesses with a metal.

7. A field effect transistor as defined in claim 6, wherein said semiconductor layer comprises a layer of semiconductor material produced epitaxially.

8. A field effect transistor as defined in claim 6, wherein said semiconductor layer has a first type of conductivity and said semiconductor body has a second type of conductivity.

9. A field effect transistor as defined in claim 6, wherein said Schottky contacts comprise contacts of T-shaped configuration arranged symmetrically to said path of said charge-carriers with the stem of the T's of the T-shaped configurations separated at their ends by said channel region.

10. A field effect transistor as defined in claim 9, wherein said two main electrodes comprise electrodes mounted on said semiconductor layer of said specific conductivity and spaced apart by said stems of said Schottky contacts and said channel region.

11. A field effect transistor as defined in claim 10, wherein said two main electrodes comprise metal filling recesses defined by said semiconductor layer of said specific type of conductivity, and extending to or near said semiconductor base and forming ohmic contacts with said semiconductor layer of said specific type of conductivity.

12. A field effect transistor as defined in claim 9, further comprising a semiconductor separating region of the opposite type of conductivity to said semiconductor layer and surrounding a part of said semiconductor layer for limiting and isolating the transistor region.

13. A field effect transistor as defined in claim 12, wherein the cross bars of the "T" of the Schottky contacts adjoins said semiconductor separating region and the association between said Schottky contacts and said semiconductor separating region is arranged to prevent current flow between said two main electrodes through a semiconductor region between said Schottky contacts and said semiconductor separating region.

14. A field effect transistor as defined in claim 11, and comprising two of said additional electrodes arranged one on either side of said direct path for said charge carriers.

15. A field effect transistor as defined in claim 14, wherein said semiconductor layer of said specific type of conductivity defines recesses for said additional electrodes extending to or near to said semiconductor base and said additional electrodes comprise metal in said recesses in ohmic contact with said semiconductor layer of said specific type of conductivity.

* * * * *

UNITED STATES PATENT OFFICE
CERTIFICATE OF CORRECTION

Patent No. 3,836,993 Dated September 17th, 1974

Inventor(s) Vishnuprakash Joshi

It is certified that error appears in the above-identified patent and that said Letters Patent are hereby corrected as shown below:

In the heading of the patent, after line 9, insert:
--Foreign Application Priority Data
Dec. 24, 1970 Germany.......2063751--;
Column 1, line 3, change "aplication" to --application--;
line 32, change "carries" to --carriers--.

Signed and sealed this 7th day of January 1975.

(SEAL)
Attest:

McCOY M. GIBSON JR.
Attesting Officer

C. MARSHALL DANN
Commissioner of Patents

ORM PO-1050 (10-69)
USCOMM-DC 60376-P69
☆ U.S. GOVERNMENT PRINTING OFFICE : 1969 O—366-334.